United States Patent
Goto

(10) Patent No.: US 7,221,057 B2
(45) Date of Patent: May 22, 2007

(54) STACKED IC DEVICE HAVING FUNCTIONS FOR SELECTING AND COUNTING IC CHIPS

(75) Inventor: Hisashi Goto, Kawasaki (JP)

(73) Assignee: Nokia Corporation, Espoo (FI)

(*) Notice: Subject to any disclaimer, the term of this patent is extended or adjusted under 35 U.S.C. 154(b) by 203 days.

(21) Appl. No.: 10/999,610

(22) Filed: Nov. 29, 2004

(65) Prior Publication Data

US 2005/0152169 A1 Jul. 14, 2005

Related U.S. Application Data

(63) Continuation of application No. PCT/JP2003/006943, filed on Jun. 2, 2003.

(30) Foreign Application Priority Data

May 31, 2002 (JP) ............................. 2002-159993

(51) Int. Cl.
*H01L 23/48* (2006.01)
*H01L 21/48* (2006.01)

(52) U.S. Cl. ....................... 257/777; 257/686; 438/109

(58) Field of Classification Search ................ 438/109; 257/777, 686

See application file for complete search history.

(56) References Cited

U.S. PATENT DOCUMENTS

| 5,656,548 | A | 8/1997 | Zavracky et al. |
| 6,621,155 | B1 * | 9/2003 | Perino et al. ............... 257/686 |
| 6,720,643 | B1 * | 4/2004 | Fox et al. .................... 257/686 |
| 7,037,757 | B2 * | 5/2006 | Fox et al. .................... 438/109 |
| 2002/0040990 | A1 | 4/2002 | Tanaka et al. |

FOREIGN PATENT DOCUMENTS

JP 6-291250 A 10/1994

* cited by examiner

*Primary Examiner*—Vibol Tan
(74) *Attorney, Agent, or Firm*—Harrington & Smith, PC

(57) ABSTRACT

In the formation of a stacked IC device formed by stacking IC chips by a plurality of levels, the number of selecting bonding wires connected to select an IC chip on a certain level is reduced. The selecting device of the IC chip on each of the levels is connected to the selecting device on a neighboring level in the form of a chain to form a shift register so that only when a trigger signal is applied to the selecting device, the selecting device sequentially transmits a signal held in itself to the selecting device on the neighboring level.

8 Claims, 5 Drawing Sheets

T2

STACKED IC DEVICE HAVING FUNCTIONS FOR SELECTING AND COUNTING IC CHIPS

This application is a U.S. Continuation Application under 35 USC 371 of International Application PCT/JP2003/006943 filed 2 Jun. 2003.

BACKGROUND OF THE INVENTION

The present invention relates to a stacked IC package formed by stacking IC chips (boards) by a plurality of levels and, more specifically, to a device having functions such as the function of selecting an IC chip on a certain level in order to enable input/output to/from the IC chip on the level in the stacked IC package.

In the formation of an FPGA (field-programmable gate array), a memory and a stacked IC package, if only two or three types of ICs are necessary, their cost performance will be improved. However, if a stacked IC package is to be formed by stacking IC chips of the same type, the I/O pads of all the IC chips need to be perpendicularly connected to one another, with the result that a bus contention problem may occur. In addition, it has conventionally been necessary to connect selecting bonding wires to all the IC chips in order to enable selection of an IC chip on a certain level in the stacked IC package.

The invention has been made in order to solve the problems of the related art, and an object of the invention is to provide a device capable of reducing the number of types of necessary IC chips in the formation of a stacked IC package.

Another object of the invention is to provide a device capable of reducing the number of selecting bonding wires to be connected to the IC chips of a stacked IC package in order to enable selection of an IC chip on a certain level in the stacked IC package. In association with this object, a further object of the invention is to provide a stacked IC package having the function of counting the number of IC chips included in a stacked IC package.

DISCLOSURE OF THE INVENTION

To achieve the above objects, the invention provides a stacked IC device formed by stacking IC chips by a plurality of levels, the IC chip on each of the levels being provided with an input/output device for performing read/write of information from/to the IC chip and a selecting device for selecting the IC chip in the stacked IC device, only an IC chip in which a signal is held in its selecting device being able to perform read/write of information to/from the IC chip through its input/output device, characterized in that the selecting device of the IC chip on each of the levels is connected to the selecting device on a neighboring level in the form of a chain to form a shift register so that only when a trigger signal is applied to the selecting device, a signal held in the selecting device is sequentially transmitted to the selecting device on the neighboring level.

The invention also provides a stacked IC device formed by stacking IC chips one on top of another by a plurality of levels, the IC chip on each of the levels being provided with an input/output device for performing read/write of information from/to the IC chip and a selecting device for selecting the IC chip in the stacked IC device, only an IC chip in which a signal is held in its selecting device being able to perform read/write of information to/from the IC chip through its input/output device, characterized in that the selecting device of the IC chip on each of the levels is connected to the selecting device on a neighboring level in the form of a chain to form a shift register so that only when a trigger signal is applied to the selecting device, a signal held in the selecting device is sequentially transmitted to the selecting device on the neighboring level, in that the IC chip on each of the levels further has a counting device for counting the number of the IC chips included in the stacked IC device and the counting device of the IC chip on each of the levels is connected to the counting device on a neighboring level in the form of a chain to form a shirt register so that only when the trigger signal is applied to the counting device, a signal held in the counting device is sequentially transmitted to the counting device on a neighboring higher level, in that the counting device of the IC chip on an odd level counted from the lowest level is connected via selecting means to the selecting device of the IC chip on a neighboring higher even level and the counting device on a neighboring lower even level so that when a signal is held in the counting device of the IC chip on the neighboring lower even level, the selecting means transmits the signal of the counting device of the IC chip on the neighboring lower even level to the counting device of the IC chip on the odd level, whereas when a signal is not held in the counting device of the IC chip on the neighboring lower even level, the selecting means transmits the signal of the selecting device of the IC chip on the neighboring higher even level to the counting device of the IC chip on the odd level, and in that the number of the IC chips included in the stacked IC device is counted on the basis of an output signal outputted from the counting device of the IC chip on the highest level in response to one input signal inputted to the selecting device of the IC chip on the highest level.

In the above-mentioned stacked IC device, the stacked IC device may be formed by alternately stacking a first type of IC chip having the selecting device, the counting device and the selecting means and disposed on an odd level counted from the lowest level and a second type of IC chip having the selecting device and the counting device and disposed on an even level counted from the highest level.

In the above-mentioned stacked IC device, the selecting means is provided with a selector which is connected to a flip flop device connected to biasing means and the counting device of the IC chip on the neighboring lower even level, and to the selecting device of the IC chip on the higher even level neighboring the flip flop device, the flip flop device being placed in the state of holding no signal by the biasing means so long as a signal is not transmitted after the initialization of the stacked IC device to the counting device of the IC chip on the neighboring lower even level, and being placed in the state of holding a signal so long as the initialization is not again performed after a signal is transmitted once after the initialization to the counting device of the IC chip on the neighboring lower even level. The selector may transmit the signal of the counting device of the IC chip on the neighboring lower even level to the counting device on the odd level when a signal is held in the flip flop, and transmit the signal of the selecting device of the IC chip on the neighboring higher level to the counting device on the odd level when a signal is not held in the flip flop.

In addition, in the stacked IC device, in the case where n (n is an integer) represents the number of output signals outputted from the counting device of the IC chip on the highest level in response to one clock signal inputted to the selecting device of the IC chip on the highest level, when the phase of the output signals is $3\Phi \times n$ ($\Phi$ is the period of the clock), the number of the IC chips included in the stacked IC device may be calculated as n×2, while when the phase of the output signals is 3Φ×n+1, the number of the IC chips included in the stacked IC device may be calculated as n×2+1.

In the stacked IC device, the initialization of the stacked IC device needs a clock period corresponding to Φ×(the number of the IC chips included in the IC package).

In the stacked IC device, the selecting device may be connected to the selecting device on the neighboring level in a staggered form via a delay device.

BEST MODE FOR CARRYING OUT THE INVENTION

The invention will be described below with reference to the accompanying drawings.

1. Device Construction 1-1. Overview

Figure 1:
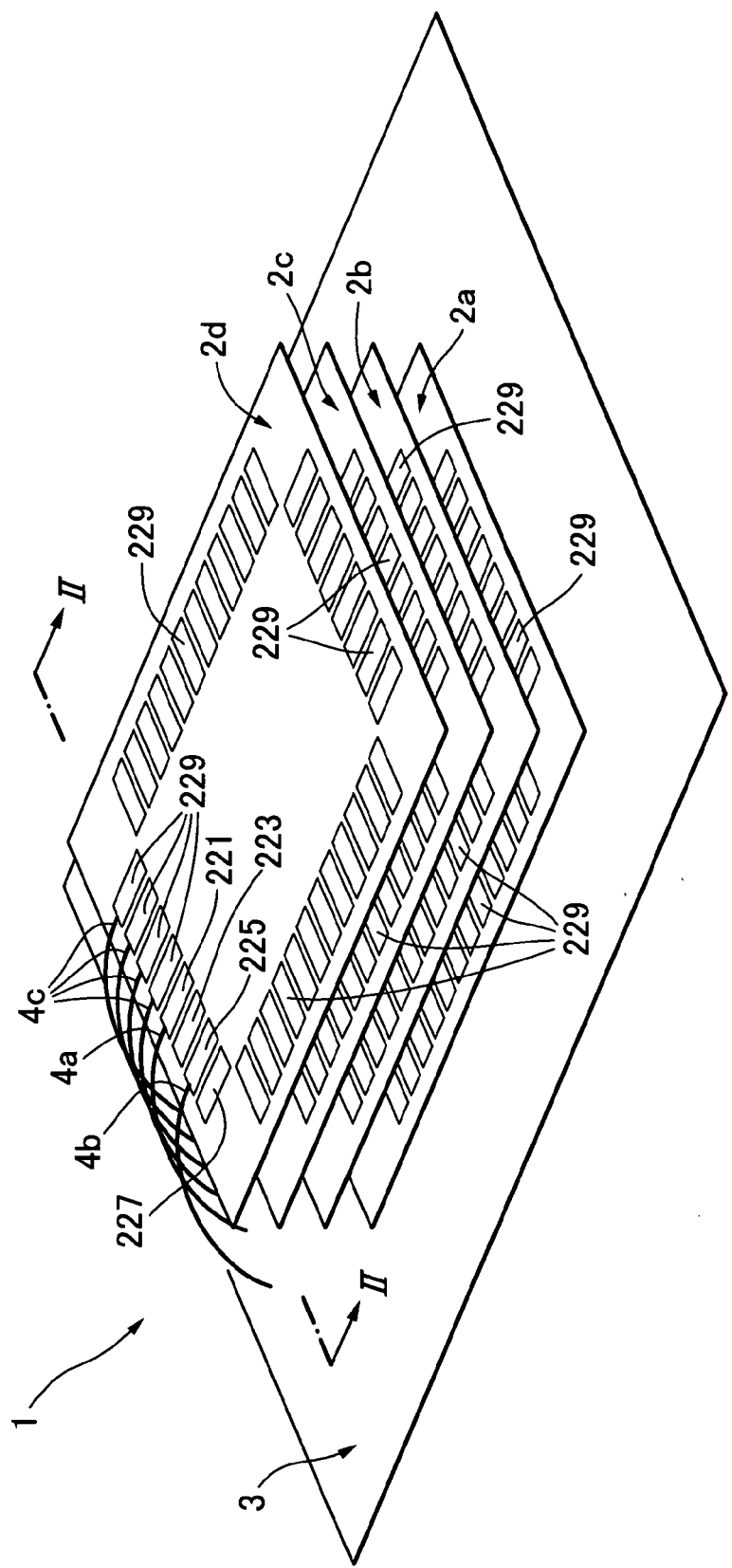
FIG. 1 is a schematic perspective view showing the internal structure of a stacked IC package according to a preferred embodiment of the invention.

FIG. 1 is a schematic perspective view showing the internal structure of a stacked IC package according to a preferred embodiment of the invention. This figure particularly shows the IC package 1 in which four IC chips 2a to 2d are stacked one on top of another, but the number of IC chips to be stacked, of course, is not limited to this number.

The IC chips 2 are stacked on a die stage 3. Each of the IC chips 2a to 2d disposed on different levels is provided with a plurality of I/O pads 221–229 to be used for transmission of signals. In the example shown in FIG. 1 in particular, eight I/O pads are provided on each of the right- and left-side surface portions, while twelve I/O pads are provided on each of the top- and bottom-side surface portions, as viewed toward the surface of the sheet of FIG. 1. However, the number of these I/O pads is not particularly limited, similarly to the number of the IC chips. Although not particularly shown, these respective I/O pads may be assumed to be connected to package pins exposed outwardly of the IC package 1.

Among the plurality of I/O pads provided on each of the levels, two I/O pads are a selecting I/O pad 223 serving as a device to be used for selecting an IC chip on a certain level in the stacked IC package 1, and an I/O pad 221 associated with the selecting I/O pad 223. Another two I/O pads are a counting I/O pad 225 serving as a device to be used for counting the number of stacked IC chips included in the IC package 1, and an I/O pad 227 associated with the counting I/O pad 225. The other I/O pad is an input/output I/O pad 229 which is an input/output device to be used for writing/ reading information to/from the IC chip.

The selecting I/O pad 223 is used for receiving an input signal and transmitting the input signal, and only the IC chip having the selecting I/O pad 223 in which the input signal is held is capable of writing/reading information to/from the IC chip via the input/output I/O pad 229. The counting I/O pad 225 is used for outputting an output signal and transmitting the output signal, and the number of IC chips included in the IC package 1 can be counted on the basis of output signals outputted through these counting I/O pads 225. The functions of the I/O pads 221 and 227 associated with the selecting I/O pad 223 and the counting I/O pad 225 will be described later.

In the example of FIG. 1 in particular, all of the selecting I/O pad 223 and the I/O pad 221 associated therewith as well as the counting I/O pad 225 and the I/O pad 227 associated therewith are shown to be provided on the left-side surface portion on each of the levels, as viewed toward the sheet surface of FIG. 1. More specifically, among the eight I/O pads provided on the left-side surface portion on each of the levels, as viewed in FIG. 1, the fourth I/O pad on the frontmost side are shown as the I/O pad 221 associated with the selecting I/O pad, the third I/O pad as the selecting I/O pad 223, the second I/O pad as the counting I/O pad 225, and the first I/O pad on the frontmost side as the I/O pad 227 associated with the counting I/O pad. However, this illustration is a mere assumption, and these four special I/O pads need only to be provided, and any of the I/O pads on any of the surface portions may also be provided as such special I/O pads.

For the sake of convenience of description, the lowest level of the stacked IC chips 2 is called the first level, and the other levels are respectively called the second level, the third level, . . . in upward order. In the invention, bonding wires 4 need only to be connected to any ones of the I/O pads of the IC chip 2d on the highest level, i.e., the fourth level. More specifically, it is not necessary to connect bonding wires to the I/O pads of any of the IC chip 2a on the first level, the IC chip 2b on the second level, and the IC chip 2c on the third level. For the sake of simplicity of illustration, FIG. 1 shows only the state of connection of the bonding wires 4 on the left-side surface portion on which particular ones of the I/O pads of the IC chip 2d on the highest level, such as IC chip selecting and counting I/O pads, are provided. Accordingly, it may be deemed that bonding wires are connected (can be connected) to all the I/O pads on the remaining surface portions (i.e., the right-side surface portion and the top and bottom-side surface portions).

Furthermore, on the left-side surface portion of FIG. 1, the bonding wires 4 are shown to be connected to one six ones of the eight I/O pads. Specifically, bonding wires 4a, 4b and 4c are shown to be respectively connected to the I/O pad 221 associated with the selecting I/O pad, the counting I/O pad 225, and the remaining four input/output I/O pads 229 among the I/O pads on the left-side surface portion. The bonding wires are respectively connected to all of the input/output I/O pads 229, but if unnecessary, i.e., if it is not necessary to input/output information to/from predetermined input/output I/O pads, it is not necessary to connect the bonding wires 4c to predetermined ones of the input/ output I/O pad 229. On the other hand, bonding wires need to be connected to two I/O pads, i.e., the I/O pad 221 associated with the selecting I/O pad and the counting I/O pad 225.

1-2. Internal Structure

Figure 2:
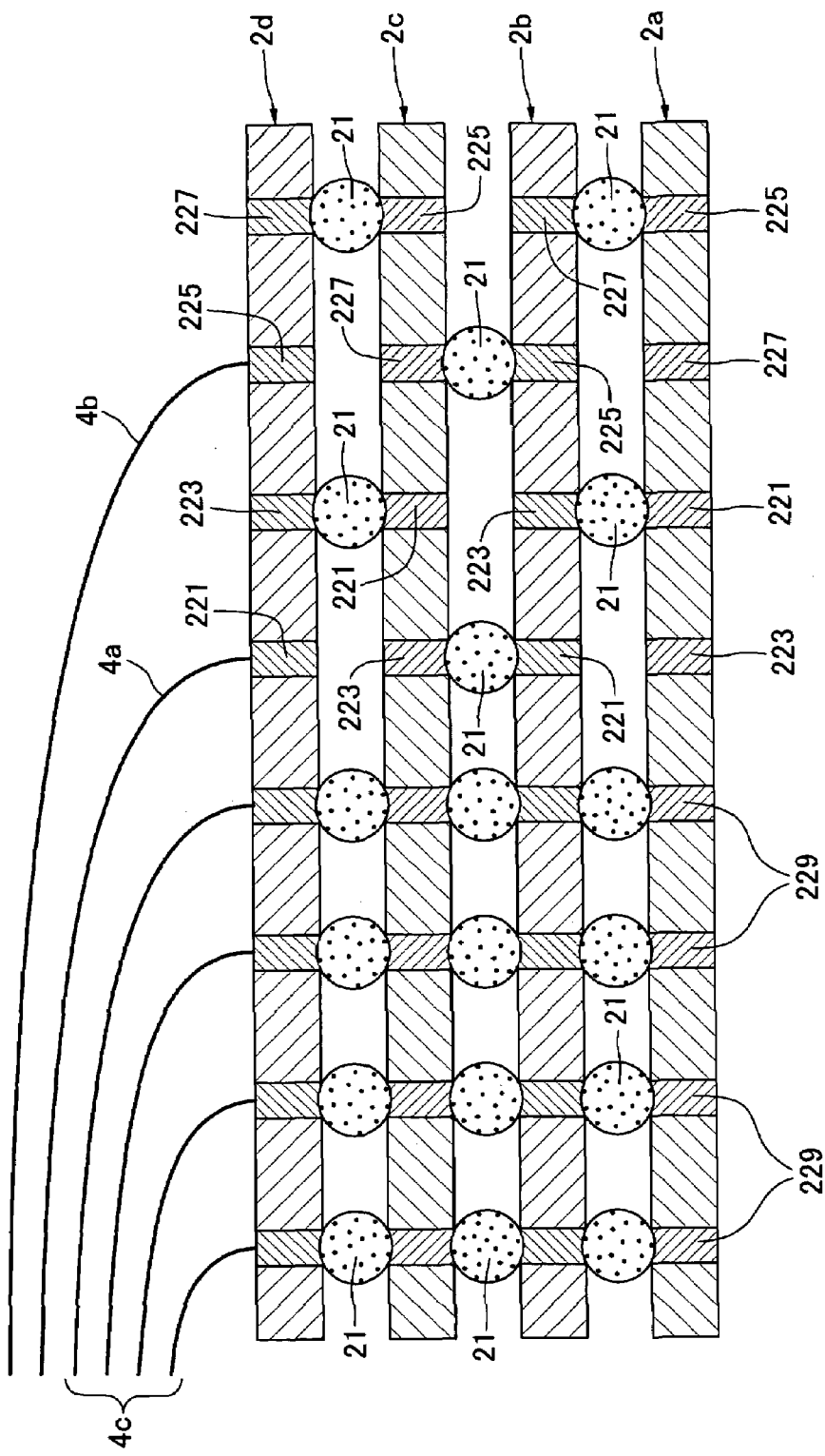
FIG. 2 is a schematic cross-sectional view taken along line II—II of FIG. 1.

FIG. 2 shows a schematic cross-sectional view taken along line II—II of FIG. 1, i.e., a cross section of the IC package as viewed from the left-side surface portions on which IC chip selecting and counting I/O pads and the like are provided.

All of the I/O pads 221, 223, 225, 227 and 229 are formed by electrically conductive through-holes. As is apparent from FIG. 2, the through-hole of each of the input/output I/O pads 229 on each of the levels is electrically connected at both ends by solder 21 to the through-hole of the corresponding one of I/O pads of an IC chip on a neighboring level in the vertical direction, whereas the through-hole of each of the selecting I/O pad 223 and the counting I/O pad 225 on each of the levels is connected in a staggered form to the through-hole of the corresponding one of the selecting I/O pad 223 and the counting I/O pad 225 of an IC chip on a neighboring level in the vertical direction via the corresponding one of the associated I/O pads 221 and 227.

More specifically, all the input/output I/O pads 229 on each of the levels are respectively connected in a direct form to the input/output I/O pads on another level in the vertical direction (provided that the bonding wires are connected to the tops of the input/output I/O pads of the IC chip on the highest level), whereas the selecting I/O pad 223 on each of the levels is connected in a staggered form to the selecting I/O pad 223 on the next lower level via the I/O pad 221 on the same lower level, and the counting I/O pad 225 on each of the levels is connected in a staggered form to the counting I/O pad 225 on another level via the I/O pad 227 on the next higher level.

Accordingly, when signals are transmitted to the input/output I/O pads 229 of the IC chip 2d on the highest level, the respective signals are transmitted to the input/output I/O pads 229 on all of the lower levels around the same time. However, in the case of the selecting I/O pads 223, even when a signal is transmitted to the selecting I/O pad 223 of the IC chip 2d on the highest level, the signal does not flow through the selecting I/O pads 223 on all of the lower levels around the same time, and is basically held by the selecting I/O pad 223 on a certain level. Similarly, in the case of the counting I/O pads 225, even when a signal is transmitted to the counting I/O pad 225 of the IC chip 2a on the lowest level, the signal does not flow through the counting I/O pads 225 on all of the higher levels around the same time, and is basically held by the counting I/O pad 225 on a certain level. It is to be noted that the signal of the selecting I/O pad 223 on each of the levels is sequentially transmitted to the selecting I/O pad 223 connected on the next lower level, by a method which will be described later, while the signal of the counting I/O pad 225 on each of the levels is sequentially transmitted to the counting I/O pad 225 connected on the next higher level, by a method which will be described later.

1-3. Details

Figure 3:
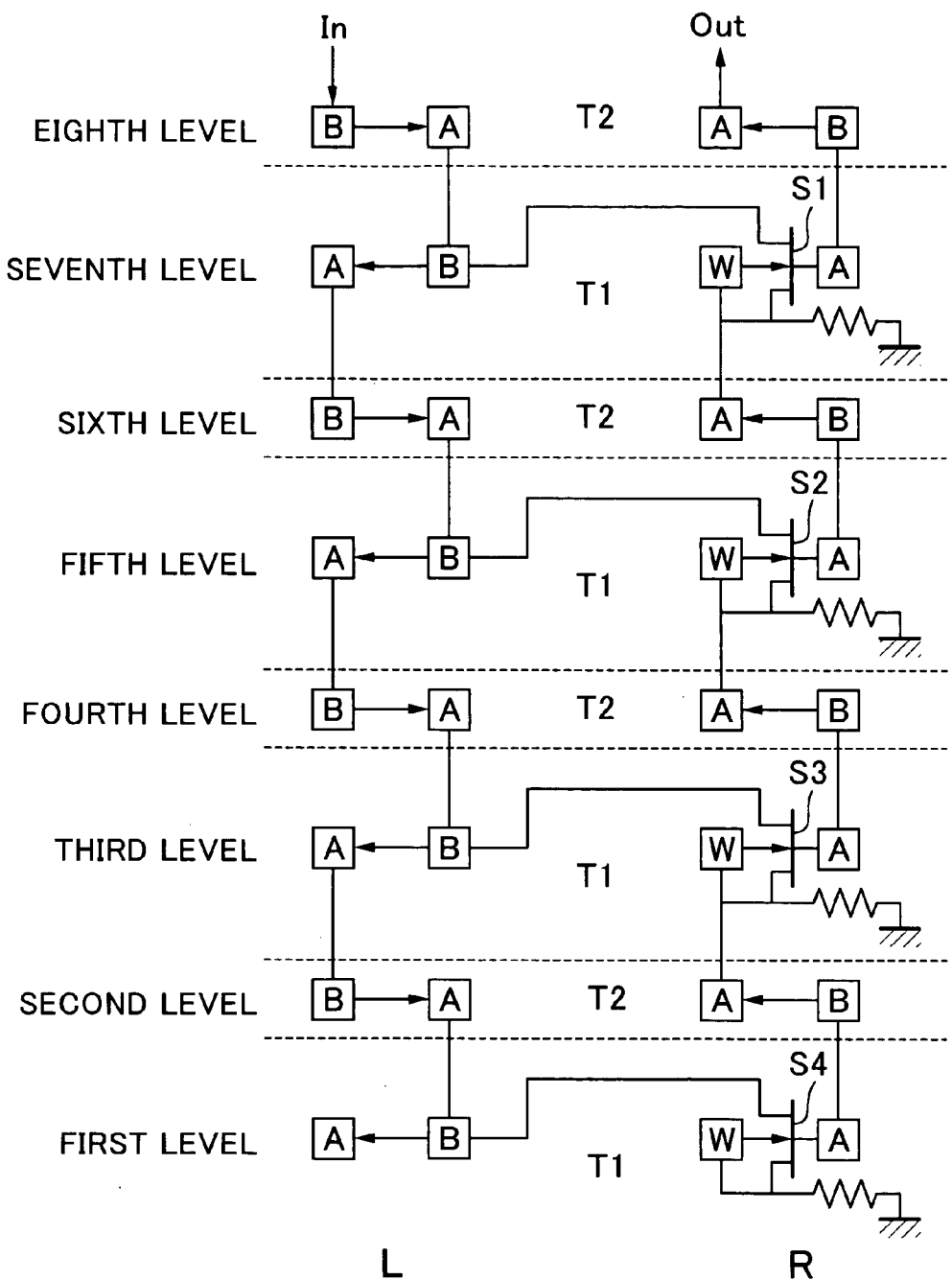
FIG. 3 is a wiring diagram of a stacked IC package according to the preferred embodiment of the invention.

FIG. 3 shows a wiring diagram of a stacked IC package according to the preferred embodiment of the invention. The stacked IC package shown in FIG. 3 has eight stacked IC chips unlike the example shown in FIGS. 1 and 2. In addition, for the sake of simplicity of illustration, FIG. 3 shows, with input/output I/O pads omitted, only four special I/O pads associated with selection and counting of IC chips (corresponding to the I/O pads 221, 223, 225 and 227 in FIGS. 1 and 2). However, the positional relationship between the I/O pads is shown as similar to that shown in FIGS. 1 and 2.

As shown in FIG. 3, the stacked IC package 1 of the invention includes two types of IC chips. For the sake of convenience, these IC chips are herein distinguished as the type T1 and the type T2. The stacked IC package 1 of the invention is formed by alternately stacking these two types of IC chips. These two types of IC chips suffice to form the stacked IC package 1 of the invention. For the sake of convenience of description, it is assumed here that the IC chips of the type T1 are used as IC chips on odd-numbered levels counted from the lowest level, i.e., the lowest level (the first level), the third level, the fifth level and the like, while the IC chips of the type T2 are used as even-numbered levels counted from the lowest level, i.e., the second level, the fourth level, the sixth level and the like.

Types of I/O Pads

As is apparent from FIG. 3, the type T1 of IC chip is made of three types of I/O pads, while the type T2 of IC chip is made of two types of I/O pads. For the sake of convenience, symbols A, B and W are assigned to the respective types of I/O pads, and the A type of I/O pad, the B type of I/O pad and the W type of I/O pad are distinguished as "I/O pad A", "I/O pad B" and "I/O pad W", respectively.

The I/O pad A is used as a shift register such as a ripple carry register, and the I/O pad A on each of the levels is connected to the I/O pads A on the other levels in the form of a chain and forms a chain of registers, i.e., a ripple carry register, together with the I/O pads A on the other levels. For example, even when the I/O pad A on any of the levels is holding a signal in itself, so long as a trigger signal indicative of transmission is not applied to the I/O pad A itself, the I/O pad A continues to hold the signal, and when the trigger signal is applied to the I/O pad A itself, the I/O pad A outputs the signal, i.e., transmits the signal to the I/O pad A on the next one of the other levels. On the other hand, in the case where the I/O pad A itself is not holding a signal but a signal exists on its input side, when a trigger signal is applied to the I/O pad A itself, the I/O pad A loads and holds the signal. As can be seen, by forming the ripple carry register by connecting these I/O pads A in the form of a chain, it is possible to sequentially transmit signals among the I/O pads A. These I/O pads A are used as the above-mentioned selecting I/O pad (223 in FIGS. 1 and 2) or the counting I/O pad (225 in FIGS. 1 and 2).

The I/O pad B is disposed between each of the I/O pads A, and prevents the I/O pads A from being directly connected to each other, thereby preventing a signal from being transmitted to all of the I/O pads A at a time; that is to say, the I/O pad A functions as a delay device operative to delay signals. In electrical terms, the I/O pad B serves a function similar to a conductor; that is to say, the I/O pad B can transmit electricity to the I/O pad A without modification. As is apparent to those skilled in the art, the I/O pad B does not have a special function, and can use a general I/O pad without modification. This I/O pad B can be used as an I/O pad (221 in FIGS. 1 and 2) associated with the above-mentioned selecting I/O pad or as an I/O pad (227 on the IC chip on each of the even-numbered levels of FIGS. 1 and 2) associated with the counting I/O pad.

The I/O pad W is an I/O pad capable of being used as a set/reset flip flop. Namely, this I/O pad W holds either a state holding a signal or a state holding no signal, so long as an input in the opposite state is not applied to the I/O pad W. More specifically, after the I/O pad W has held a signal once after initialization of the IC package, the I/O pad W maintains the signal so long as the IC package is again initialized. This I/O pad W is used as an I/O pad (227 on the IC chip on each of the odd levels of FIGS. 1 and 2) associated with the above-mentioned counting I/O pad.

<Construction of IC Chip of Type T1>

The type T1 of IC chip is made of four I/O pads and one selector. Among the four I/O pads, two I/O pads are I/O pads A, another I/O pad is an I/O pad B, and the other I/O pad is an I/O pad W. In this type T1 of IC chip in particular, the left-side I/O pad A functions as a selecting I/O pad, the right-side I/O pad A functions as a counting I/O pad, the I/O pad B functions as a delaying I/O pad associated with the selecting I/O pad, and the I/O pad W functions as a flip-flop I/O pad associated with the counting I/O pad. The I/O pad W functions as selecting means in cooperation with the selector, as will be apparent from the following description.

In this type T1 of IC chip (for example, the IC chip on the seventh level), the delaying I/O pad B is connected to the selecting I/O pad A and the selector, and the I/O pad W is also connected to the selector. Since the I/O pad W is also connected to ground via biasing means, for example, a resistor, the I/O pad W is placed in the state of holding no signal, at the time of initialization (which will be described later) of the stacked IC device.

During formation of the stacked IC device, when the IC chip of the type T1 is connected to an IC chip of the type T2 on a neighboring lower level (for example, the IC chip on the sixth level in the above-mentioned example), the selecting I/O pad A is connected to the selecting I/O pad A on the neighboring lower level via the delaying I/O pad B on the same lower level, to form a ripple carry register in the form of a chain. Accordingly, when a trigger signal is applied to the selecting I/O pad A, the selecting I/O pad A sequentially transmits a signal held in itself to the selecting I/O pad A on the neighboring lower level.

Furthermore, when the IC chip of the type T1 is connected to an IC chip of the type T2 on a neighboring higher level (for example, the IC chip on the eighth level in the above-mentioned example), the counting I/O pad A is connected to the counting I/O pad A on the neighboring higher level via the delaying device on the same higher level, to form a ripple carry register in the form of a chain. Accordingly, when a trigger signal is applied to the counting I/O pad A, the counting I/O pad A sequentially transmits a signal held in itself to the counting I/O pad A on the neighboring higher level. Similarly, the delaying I/O pad B is connected to the selecting I/O pad A on the neighboring higher level, whereby the signal from the selecting I/O pad A on the neighboring higher level is also transmitted to the selector connected to this delaying I/O pad B.

Furthermore, except the IC chip on the lowest level, when this type T1 of IC chip is connected to the IC chip of the type T2 on the neighboring lower level, the counting I/O pad A is connected to the counting I/O pad A of the IC chip on the neighboring lower level via the selector and the I/O pad W, whereby the counting I/O pad A can receives a signal from either the selecting I/O pad A on the neighboring higher level or the counting I/O pad A on the neighboring lower level in cooperation with the I/O pad W and the selector. This point will be described below in further detail. When a signal is held in the I/O pad W, the selector selects a signal from the counting I/O pad A on the neighboring lower level, i.e., transmits the signal from the counting I/O pad A on the neighboring lower level to the counting I/O pad A, whereas when a signal is not held in the I/O pad W, the selector selects a signal from the selecting I/O pad A on the neighboring higher level, i.e., transmits the signal from the selecting I/O pad A on the neighboring higher level to the counting I/O pad A. Since the I/O pad W is connected to ground via a resistor as described above, the I/O pad W is placed in the state of holding no signal, at the time of initialization of the stacked IC device, but when a signal is held in the counting I/O pad A on the neighboring lower level, the I/O pad W is placed into the state of holding a signal, and once the signal is held in the I/O pad W, the signal is held so long as the stacked IC package is not initialized.

<Construction of IC Chip of Type T2>

The type T2 of IC chip is made of four I/O pads. Among these four I/O pads, two I/O pads are I/O pads A, and the other two I/O pads are I/O pads B. In this type T2 of IC chip, the left-side I/O pad A functions as a selecting I/O pad, the right-side I/O pad A functions as a counting I/O pad, the left-side I/O pad B functions as a delaying I/O pad associated with the selecting I/O pad, and the right-side I/O pad B functions as a delaying I/O pad associated with the counting I/O pad.

In this type T2 of IC chip (for example, the IC chip on the sixth level), the delaying I/O pad B is connected to the selecting I/O pad A.

Furthermore, during formation of the stacked IC device, when the IC chip of the type T2 is connected to an IC chip of the type T1 on a neighboring lower level (for example, the IC chip on the fifth level in the above-mentioned example), the selecting I/O pad A is connected to the selecting I/O pad A on the neighboring lower level via the delaying I/O pad B on the same lower level, to form a ripple carry register in the form of a chain. Accordingly, when a trigger signal is applied to the selecting I/O pad A, the selecting I/O pad A sequentially transmits a signal held in itself to the selecting I/O pad A on the neighboring lower level.

In addition, when the IC chip of the type T2 is connected to an IC chip of the type T1 on a neighboring higher level (for example, the IC chip on the seventh level in the above-mentioned example), the counting I/O pad A is connected to the counting I/O pad A on the neighboring higher level via the selector on the same higher level, to form a ripple carry register in the form of a chain. Accordingly, when a trigger signal is applied to the counting I/O pad A, the counting I/O pad A sequentially transmits a signal held in itself to the counting I/O pad A on the neighboring higher level.

2. Description of Operation

Figure 4:
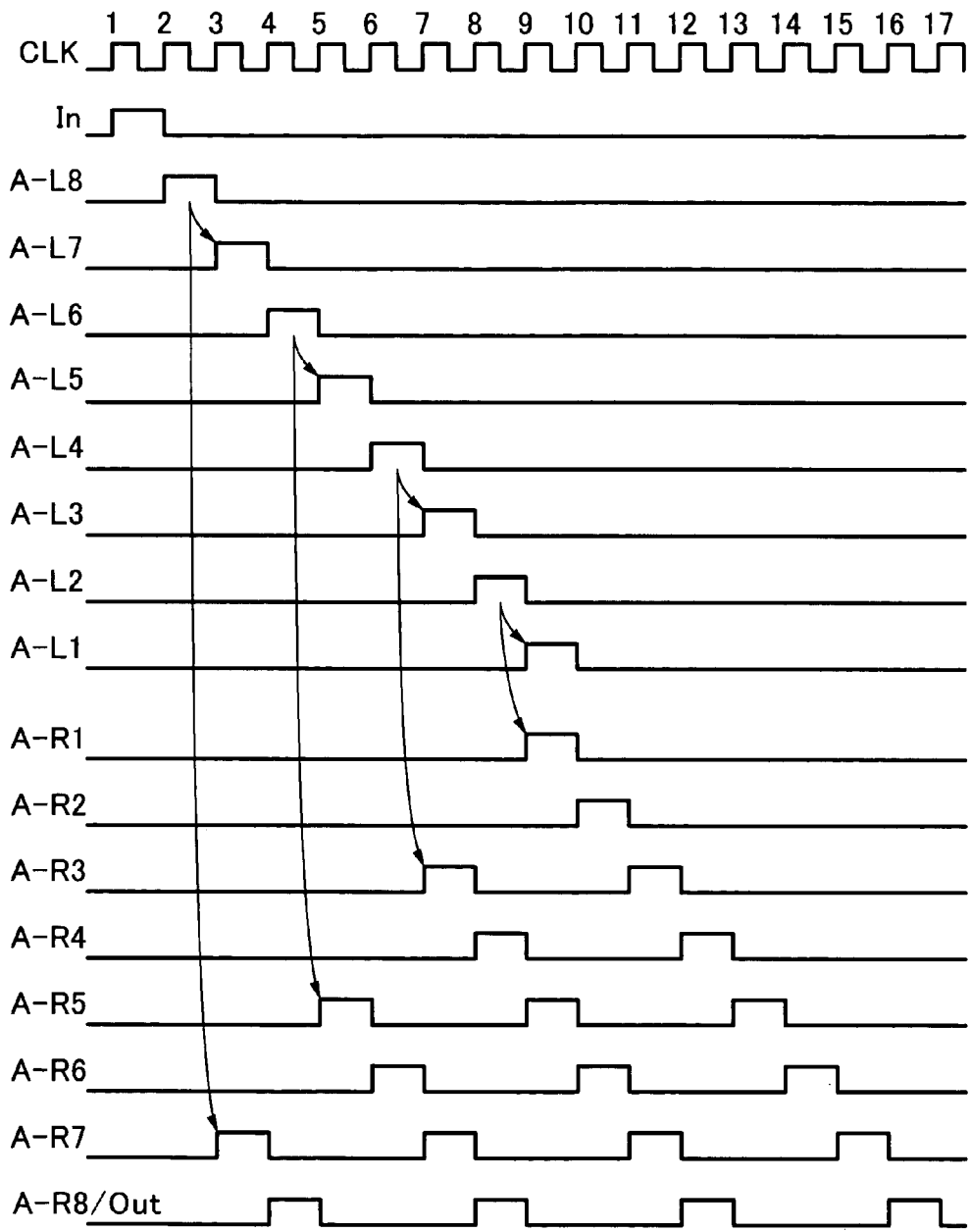
FIG. 4 is a timing chart showing signals appearing in I/O pads A.

The operation of the stacked IC package according to the invention will be described below with reference to FIGS. 3 and 4. FIG. 4 is a timing chart showing signals appearing in the I/O pads A in particular. In FIG. 4, for the sake of convenience, in addition to the above-mentioned symbols A, B and W used for distinguishing the I/O pads, numbers "1", "2", . . . are used to denote the level numbers of the IC chips such as the first level and the second level, symbol "L" is used to denote each of the left-side selecting I/O pads, and symbol "R" is used to denote each of the right-side counting I/O pads.

In the following description of operation, these symbols are used as follows: the selecting I/O pad A on the lowest level, i.e., the first level, is denoted by "A-L1", the selecting I/O pad B on the first level by "B-L1", the selecting I/O pad A on the second level by "A-L2", the selecting I/O pad B on the first level by "B-L2", the IC chip counting I/O pad A on the first level by "A-R1", the counting I/O pad B on the first level by "B-R1", the counting I/O pad A on the second level by "A-R2", the selecting I/O pad B on the first level by "B-R2", the flip-flop I/O pad W on the first level by "W-R1", and so on. In other words, in FIG. 4 using these symbols, there is shown a timing chart of the selecting I/O pads A-L1 to A-L8 and the counting I/O pads A-R1 to A-R8.

For the sake of convenience of description, in the following description, it is assumed that the IC package 1 according to the invention operates in accordance with clock signals, and the clock signals are used as trigger signals to be respectively inputted to the I/O pads A-L1 to A-L8 and the I/O pads A-R1 to A-R8. However, the trigger signals, of course, are not limited to the clock signals.

2-1. Selection of IC Chip

For selection of IC chips, the I/O pads on the left side (L), i.e., the selecting I/O pads, i.e., the I/O pads A-L1 to A-L8, and I/O pads associated therewith, i.e., the I/O pads B-L1 to B-L8, are used. It is assumed here that an input signal (In) for IC chip selecting operation is applied to the I/O pad B-L8, while output signals are outputted from the selecting I/O pad A-L1, the delaying B-L1 and the like on each of the levels to an input/output I/O pad (not shown) on the same level. In this IC chip selecting operation, it may be understood that the input signal is sequentially transmitted downwardly from A-L8 to A-L7, . . . by the function of a ripple carry chain of the selecting I/O pads.

First of all, the IC package 1 is initialized by the first clock signal.

An input signal is applied to the IC package 1 in response to the second clock signal. Namely, a signal is applied to the delaying I/O pad B-L8 through a bonding wire (corresponding to 4a in FIGS. 1 and 2) connected to this delaying I/O pad B-L8. At this time, the delaying I/O pad B-L8 applies the signal to the selecting I/O pad A-L8 without modification, and since a trigger signal is inputted to this selecting I/O pad A-L8 at the same time, the I/O pad A-LB loads the signal applied on its input side into itself and holds the loaded signal. Accordingly, output signals are supplied from the selecting I/O pad A-L8 and the delaying I/O pad B-L8 on the eighth level to the respective I/O pads on the same level. It is assumed here that trigger signals are applied to all the I/O pads A at the same time. Namely, when a trigger signal is applied to the selecting I/O pad A-L8, trigger signals are also applied to the other I/O pads A, i.e., the selecting I/O pads A-L2 to A-L7 and the counting I/O pads A-L1 to A-L8 (this assumption also applies to the following description).

Trigger signals are inputted to the selecting I/O pads A-L8 and A-L7 in response to the third clock signal, so that a signal is outputted from the selecting I/O pad A-L8 and this signal outputted is transmitted to the selecting I/O pad A-L7 through the delaying I/O pad B-L7. Accordingly, output signals are supplied from the selecting I/O pad A-L7 and the delaying I/O pad B-L7 on the seventh level to the respective I/O pads on the same level.

Trigger signals are inputted to the selecting I/O pads A-L7 and A-L6 in response to the fourth clock signal, so that a signal is outputted from the selecting I/O pad A-L7 and this signal outputted is transmitted to the selecting I/O pad A-L6 through the delaying I/O pad B-L6. Accordingly, output signals are supplied from the selecting I/O pad A-L6 and the delaying I/O pad B-L6 on the sixth level to the respective I/O pads on the same level.

Subsequently, similar operations are repeated.

Figure 5:
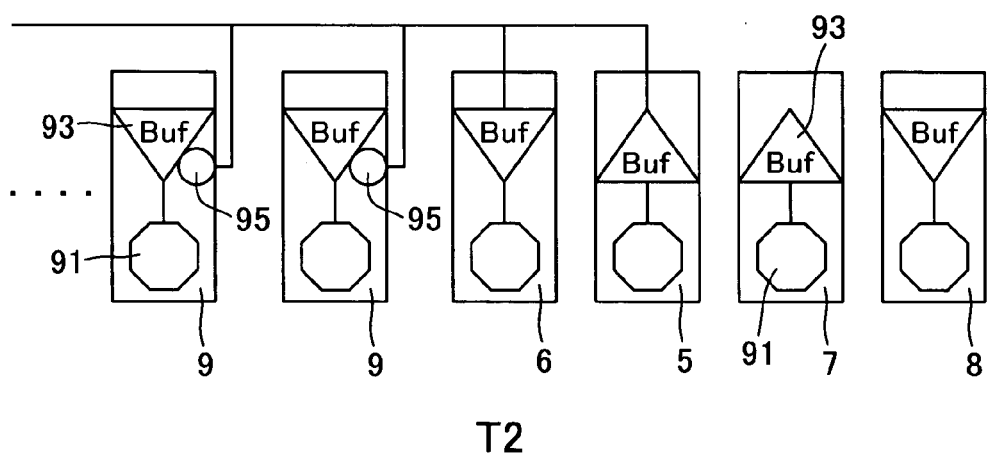
FIG. 5 shows in block form the selection principle of input/output I/O pads according to the invention.

FIG. 5 schematically shows in block form the relationship between a selecting I/O pad 5, a delaying I/O pad 6 associated with this selecting I/O pad, a counting I/O pad 7, a delaying I/O pad 8 associated with this counting I/O pad, and ordinary input/output I/O pads 9 according to the invention in the type T2 in particular. The construction of each of the I/O pads will be described below in brief. As is apparent from this figure, each of the I/O pads is made of a pad section 91 to which a signal is to be actually transmitted through a bonding wire, solder or the like, and a buffer (Buf) section 93 for holding the signal, and each of the input/output I/O pads 9 has an enable section 95 for enabling transmission of a signal to the buffer section 93. The input/output I/O pad 9 holds the signal of the pad section 91 in the buffer section 93 only when a signal is applied to this enable section 95. In FIG. 5, the positional relationship between the I/O pads is shown to be the same as that shown in FIG. 4, and only two input/output I/O pads 9 are shown for the sake of simplicity of illustration.

As shown in the block diagram of FIG. 5, the output signals from the selecting I/O pad 5 and the delaying I/O pad 6 associated therewith are applied to the enable sections 95 of the respective input/output I/O pads 9 through the shown interconnection lines. Accordingly, the input/output I/O pads 9 are enabled, and the input/output I/O pads 9 enables input/output of signals to themselves, i.e., read/write of information from/to themselves. In this manner, the output signals from the selecting I/O pad 5 and the delaying I/O pad 6 associated therewith are used for IC chip selection. Incidentally, signals from the counting I/O pad 7 and the delaying I/O pad 8 associated with this counting I/O pad are independent of the selection of IC chips in particular.

2-2. Counting of Number of Stacked IC Chips

The IC package of the invention includes an arbitrary number of IC chips, and when these IC chips are to be selected, the number of the stacked IC chips included in the IC package needs to be confirmed.

For the counting of the number of the stacked IC chips, in addition to the I/O pads used for the selection of the IC chips, the I/O pads on the right side (R), i.e., the counting I/O pads, i.e., the I/O pads A-R1 to A-R8; the I/O pads associated therewith, i.e., the I/O pads B-R2, B-R4, B-R6 and B-R8; the flip-flop I/O pads, i.e., the I/O pads W-R1, W-R3, W-R5 and W-R7; and the selectors S1 to S4 are used. It is to be noted that the counting of the IC chips is performed in association with the operation of selecting the IC chips, but does not function independently of this operation. An input signal for the operation of selecting the IC chips is used as an input signal (In) for this IC chip counting operation, while an output signal (OUT) is obtained from the counting I/O pad A-R8. As will be described later in detail, the number of the stacked IC chips is counted on the basis of the output signal obtained from the I/O pad A-R8. In this IC chip counting operation, it may be understood that the input signal is sequentially transmitted downwardly from the selecting I/O pad A-L8 to the selecting I/O pad A-L7, . . . and at the same time, in accordance with the signals of the selecting I/O pads A-L7, A-L5, A-L3 and A-L1 from those selecting I/O pads, signals are generated in the counting I/O pads A-R7, A-R5, A-R3 and A-R1, and the signals generated in these counting I/O pads are sequentially transmitted upwardly from A-R1 to A-R2, . . . , by the function of a ripple carry chain of the counting I/O pads.

First of all, the IC package 1 is initialized by the first clock signal.

An input signal is applied to the IC package 1 in response to the second clock signal. Namely, a signal is applied to the delaying I/O pad B-L8 through a bonding wire (corresponding to 4a in FIGS. 1 and 2) connected to the delaying I/O pad B-L8. At this time, the delaying I/O pad B-L8 applies the signal to the selecting I/O pad A-L8 without modification, and since a trigger signal is inputted to this selecting I/O pad A-L8 at the same time, the I/O pad A-L8 loads the signal applied on its input side into itself and holds the loaded signal.

Trigger signals are inputted to the selecting I/O pads A-L8 and A-L7 in response to the third clock signal, so that the signal of the selecting I/O pad A-L8 is transmitted to the selecting I/O pad A-L7 through the delaying I/O pad B-L7. At the same time, the signal of the selecting I/O pad A-L8 is applied to the selector S1 through the delaying I/O pad B-L7. At this time, since the I/O pad W-R7 is not holding a signal, the selector S1 selects the signal of the selecting I/O pad A-L8, i.e., applies the signal to the counting I/O pad A-R7. Accordingly, the signal is held by the I/O pad A-R7 in response to the third clock signal.

Trigger signals are inputted to A-R8 and A-R7 in addition to the selecting I/O pads A-L8 and A-L7 in response to the fourth clock signal, so that the signal of the selecting I/O pad A-L7 is transmitted to the selecting I/O pad A-L6 via the delaying I/O pad B-L6, while the signal of the counting I/O pad A-R7 is transmitted to the counting I/O pad A-R8 via the delaying I/O pad B-R8. Accordingly, the signal is held in the I/O pad A-R8, and a signal is generated in a bonding wire connected to this I/O pad (corresponding to 4b in FIGS. 1 and 2).

Then, in response to the fifth clock signal, the signal of the selecting I/O pad A-L6 is transmitted to the selecting I/O pad A-L5 via the delaying I/O pad B-L5, while this signal is transmitted to the counting I/O pad A-R5 via the delaying I/O pad B-L5. The function of the selector S2 is the same as that mentioned above in the description of the third clock signal.

In response to the sixth clock signal, the signal of the selecting I/O pad A-L5 is transmitted to the selecting I/O pad A-L4 via the delaying I/O pad B-L4, while the signal held in the counting I/O pad A-R5 is transmitted to the counting I/O pad A-R6 via the delaying I/O pad B-R6. Accordingly, the signal is held in the I/O pad A-R6.

In response to the seventh clock signal, the signal outputted from the selecting I/O pad A-L4 is transmitted to the selecting I/O pad A-L3, while the signal of the selecting I/O pad A-L4 is transmitted to the counting I/O pad A-R3 via the delaying I/O pad B-L3 by the function of the selector S3, and further, the signal held in the counting I/O pad A-R6 is transmitted to the counting I/O pad A-R7 by the function of the selector S1. This is because, owing to the signal held in the counting I/O pad A-R6, the I/O pad W-R7 is brought to the state of holding the signal, so that the signal from the counting I/O pad A-R6 is selected by the selector S1.

In response to the eighth clock signal, the signal outputted from the selecting I/O pad A-L3 is transmitted to the selecting I/O pad A-L2, while the signal of the counting I/O pad A-R3 is transmitted to the counting I/O pad A-R4 via the delaying I/O pad B-R4, and the signal of the counting I/O pad A-R7 is transmitted to the counting I/O pad A-R8 and is, therefore, outputted to a bonding wire (corresponding to 4b in FIGS. 1 and 2).

Furthermore, in response to the ninth clock signal, the signal of the selecting I/O pad A-L2 is transmitted to the selecting I/O pad A-L1, while the signal of the selecting I/O pad A-R2 is transmitted to the counting I/O pad A-R1 by the function of the selector S4, and the signal of the counting I/O pad A-R4 is transmitted to the counting I/O pad A-R5 by the function of the selector S2.

Subsequently, similar operations are repeated.

The signal is sequentially transmitted in this manner, and the signals shown in FIG. 4 appear in the respective I/O pads. However, during the counting of the number of the stacked IC chips, attention need only be paid to the output signal of the I/O pad A-R8 in particular.

The number of the stacked IC chips can be counted by counting the number of signals (pulses) which are outputted to the counting I/O pad A-R8 (or the delaying I/O pad B-R8) on the highest level after one clock signal has been inputted to the delaying I/O pad B-L8 (or the selecting I/O pad A-L8) on the highest level, and by detecting the phase of the signals outputted to the counting I/O pad A-R8.

Counting methods for the number of stacked IC chips differ according to whether the number of stacked IC chips is even or odd. Whether the number of stacked IC chips is even or odd can be determined from the phase of signals outputted from the counting I/O pad A-R8. As is apparent from FIGS. 3 and 4 as well as FIGS. 6 and 7, in the case where the number of signals (pulses) outputted to the counting I/O pad A-R8 (or the delaying I/O pad B-R8) by one clock signal is represented by n (n is an integer) and the period of a clock is represented by $\Phi$, when the number of stacked IC chips is even, the phase of the signals is $3\Phi \times n$, while when the number of stacked IC chips is odd, the phase of the signals is $3\Phi \times n+1$. Furthermore, when the number of stacked IC chips is even, the number of stacked IC chips can be calculated as $n \times 2$, for example, $4 \times 2=8$ in the example of FIG. 3. On the other hand, when the number of stacked IC chips is even, the number of stacked IC chips can be calculated as $n \times 2+1$, for example, $3 \times 2+1=7$ in the example of FIG. 4. By using this calculating formula or phase relationship, it is possible to easily count the number of stacked IC chips included in the IC package.

2-3. Initialization

As is apparent from the above description of operation as well, when the IC package is to be initialized, the input signal is applied to the delaying I/O pad B-L8, and the initialization needs only to wait for a predetermined number of clock periods. More specifically, the initialization of the IC package needs clock periods corresponding to $\Phi \times$the number of stacked IC chips (the number of IC chips stacked in the IC package).

3. Advantage of the Invention

According to the invention, when a stacked IC package is to be formed, the number of types of necessary IC chips can be made two. In addition, according to the invention, the number of selecting bonding wires to be connected to an IC chip in the stacked IC package in order to select an IC chip on a certain level can be made only two.

The invention claimed is:

1. A stacked IC device comprising a stack of IC chips having a plurality of levels, the IC chip on each of the levels being provided with an input/output device for performing read/write of information from/to the IC chip and a selecting device for selecting the IC chip in the stacked IC device, wherein only an IC chip in which a signal is held in its selecting device is able to perform read/write of information to/from the IC chip through its input/output device, wherein the selecting device of the IC chip on each of the levels is connected to the selecting device on a neighboring level in the form of a chain to form a shift register so that only when a trigger signal is applied to the selecting device, a signal held in the selecting device is sequentially transmitted to the selecting device on the neighboring level.

2. A stacked IC device comprising a stack of IC chips one on top of another having a plurality of levels, the IC chip on each of the levels being provided with an input/output device for performing read/write of information from/to the IC chip and a selecting device for selecting the IC chip in the stacked IC device, wherein only an IC chip in which a signal is held in its selecting device is able to perform read/write of information to/from the IC chip through its input/output device, wherein the selecting device of the IC chip on each of the levels is connected to the selecting device on a neighboring level in the form of a chain to form a shift register so that only when a trigger signal is applied to the selecting device, a signal held in the selecting device is sequentially transmitted to the selecting device on the neighboring lower level, wherein IC chip on each of the levels further has a counting device for counting the number of the IC chips included in the stacked IC device and the counting device of the IC chip on each of the levels is connected to the counting device on a neighboring level in the form of a chain to form a shift register so that only when the trigger signal is applied to the counting device, a signal held in the counting device is sequentially transmitted to the counting device on a neighboring higher level, wherein the counting device of the IC chip on an odd level counted from the lowest level is connected via selecting means to the selecting device of the IC chip on a neighboring higher even level and the counting device on a neighboring lower even level so that when a signal is held in the counting device of the IC chip on the neighboring lower even level, the selecting means transmits the signal of the counting device of the IC chip on the neighboring lower even level to the counting device of the IC chip on the odd level, whereas when a signal is not held in the counting device of the IC chip on the neighboring lower even level, the selecting means transmits the signal of the selecting device of the IC chip on the neighboring higher even level to the counting device of the IC chip on the odd level, and wherein the number of the IC chips included in the stacked IC device is counted on the basis of an output signal outputted from the counting device of the IC chip on the highest level in response to one input signal inputted to the selecting device of the IC chip on the highest level.

3. A stacked IC device according to claim 2, wherein the stacked IC device is formed by alternately stacking a first type of IC chip having the selecting device, the counting device and the selecting means and disposed on an odd level counted from the lowest level and a second type of IC chip having the selecting device and the counting device and disposed on an even level counted from the lowest level.

4. A stacked IC device according to claim 3, wherein the selecting means is provided with a selector which is connected to a flip flop device connected to biasing means and the counting device of the IC chip on the neighboring lower even level, and to the selecting device of the IC chip on the higher even level neighboring the flip flop device, the flip flop device being placed in the state of holding no signal by the biasing means so long as a signal is not transmitted after the initialization of the stacked IC device to the counting device of the IC chip on the neighboring lower even level, and being placed in the state of holding a signal so long as the initialization is not again performed after a signal is transmitted once after the initialization to the counting device of the IC chip on the neighboring lower even level, the selector transmitting the signal of the counting device of the IC chip on the neighboring lower even level to the counting device on the odd level when a signal is held in the flip flop, and transmitting the signal of the selecting device of the IC chip on the neighboring higher level to the counting device on the odd level when a signal is not held in the flip flop.

5. A stacked IC device according to claim 3, wherein in the case where represents the number of output signals outputted from the counting device of the IC chip on the highest level in response to one clock signal inputted to the selecting device of the IC chip on the highest level, when the phase of the output signals is $3\Phi \times n$ ($\Phi$ is the period of the clock), the number of the IC chips included in the stacked IC device is $n \times 2$, while when the phase of the output signals is $3\Phi \times n+1$, the number of the IC chips included in the stacked IC device is $n \times 2+1$.

6. A stacked IC device according to claim 5, wherein the initialization of the stacked IC device needs a clock period corresponding to $\Phi \times$(the number of the IC chips included in the stacked IC device).

7. A stacked IC device according to claim 1, wherein the selecting device is connected to the selecting device on the neighboring level in a staggered form via a delay device.

8. A stacked IC device according to claim 2, wherein in the case where n (n is an integer) represents the number of output signals outputted from the counting device of the IC chip on the highest level in response to one clock signal inputted to the selecting device of the IC chip on the highest level, when the phase of the output signals is $3\Phi \times n$ ($\Phi$ is the period of the clock), the number of the IC chips included in the stacked IC device is $n \times 2$, while when the phase of the output signals is $3\Phi \times n+1$, the number of the IC chips included in the stacked IC device is $n \times 2+1$.

* * * * *

UNITED STATES PATENT AND TRADEMARK OFFICE
CERTIFICATE OF CORRECTION

| | | |
|---|---|---|
| PATENT NO. | : 7,221,057 B2 | Page 1 of 1 |
| APPLICATION NO. | : 10/999610 | |
| DATED | : May 22, 2007 | |
| INVENTOR(S) | : Chikara Yamamoto | |

It is certified that error appears in the above-identified patent and that said Letters Patent is hereby corrected as shown below:

Claim 5, Column 14, line 21, after "where" please insert --n (n is an integer)--.

Signed and Sealed this

Third Day of July, 2007

JON W. DUDAS
*Director of the United States Patent and Trademark Office*